(12) United States Patent
Kim et al.

(10) Patent No.: US 6,288,902 B1
(45) Date of Patent: *Sep. 11, 2001

(54) MODULAR DATA STORAGE SYSTEM FOR REDUCING MECHANICAL SHOCK AND VIBRATIONS

(75) Inventors: Kwang Ho Kim, Santa Clara; Julie McDonald, San Jose, both of CA (US)

(73) Assignee: Hewlett-Packard Company, Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/318,512

(22) Filed: May 25, 1999

(51) Int. Cl.$^7$ ........................................ H05K 7/14

(52) U.S. Cl. ................ 361/725; 361/727; 361/753; 361/759; 361/788; 361/801; 361/802; 439/62; 439/64; 70/85; 312/223.1; 312/223.2; 211/41.17; 206/701; 206/707

(58) Field of Search .................... 361/725, 724, 361/726, 727, 683, 684, 685, 753, 754, 756, 759, 788, 787, 801, 802; 439/59, 61, 62, 64; 70/85; 312/223.1, 223.2; 211/41.17; 206/701, 707

(56) References Cited

U.S. PATENT DOCUMENTS

| | | | |
|---|---|---|---|
| 3,603,845 | * 9/1971 | Beers | 361/796 |
| 3,697,084 | 10/1972 | Ban | 274/4 F |
| 3,959,823 | 5/1976 | Heidecker et al. | 360/99 |
| 3,964,098 | 6/1976 | Kramer et al. | 360/93 |
| 4,062,049 | 12/1977 | Dirks | 360/78 |
| 4,194,224 | 3/1980 | Grapes et al. | 360/97 |
| 4,337,499 | * 6/1982 | Cronin et al. | 361/687 |
| 4,349,850 | 9/1982 | Harvey | 360/74.2 |
| 4,359,762 | 11/1982 | Stolloz | 360/98 |

(List continued on next page.)

FOREIGN PATENT DOCUMENTS

| | | |
|---|---|---|
| 808848 | 2/1956 | (DE) . |
| 52-218815 | 2/1977 | (JP) . |
| 57-94687 | 12/1980 | (JP) . |

OTHER PUBLICATIONS

Signal, Oct. 1982, p. 102 (5800R).
Defense Electronics, Oct. 1982, p. 34 (Rolm Military Hard Disk).
Signal, Oct. 1982, p. 102 (Dataflux).
Mini–Micro Systems, Jun. 1981.
Signal, Dec. 1981, (Mil–Spec From Ground Up).
Defense Electronics, Mar. 1981, p. 97 (Miltope Corporation).
Defense Electronics, Dec. 1982, p. 51 (Sunstrand Data Control, Inc.).
IBM Technical Disclosure Bulletin, vol. 24(1A), Jun. 1981.
IBM Technical Disclosure Bulletin, vol. 19 (10), Mar. 1977.
Compaq ProLiant Server 1998.
Dell PowerEdge Server 1998.

(List continued on next page.)

Primary Examiner—Jeffrey Gaffin
Assistant Examiner—David Foster

(57) ABSTRACT

The present invention provides a modular data storage system that can constraint movement of a data storage module within an enclosure during operation, handling, and transportation. The present invention achieves the objective by employing compliant features at strategic locations in the data storage system by utilizing shock/vibration isolators and the frictional forces generated by the compliant elements to introduce damping effects. In addition, this invention provides a locking mechanism that will allow the user to smoothly insert, remove and firmly grip a data storage module.

16 Claims, 11 Drawing Sheets

U.S. PATENT DOCUMENTS

| | | | |
|---|---|---|---|
| 4,413,328 | 11/1983 | Videki, II | 364/900 |
| 4,633,250 | 12/1986 | Hanson | 360/98 |
| 4,716,495 * | 12/1987 | Craker | 361/725 |
| 4,912,580 | 3/1990 | Hanson | 360/98.01 |
| 5,006,961 * | 4/1991 | Monico | 361/788 |
| 5,122,914 | 6/1992 | Hanson | 360/98.01 |
| 5,313,369 * | 5/1994 | Lewis et al. | 361/796 |
| 5,327,308 | 7/1994 | Hanson | 360/97.01 |
| 5,396,401 * | 3/1995 | Nemoz | 361/690 |
| 5,515,215 | 5/1996 | Hanson | 360/97.01 |
| 5,517,373 | 5/1996 | Hanson | 360/97.01 |
| 5,563,748 | 10/1996 | Hanson | 360/97.01 |
| 5,602,696 | 2/1997 | Hanson | 360/97.01 |
| 5,642,264 * | 6/1997 | Cantrell | 361/802 |
| 5,652,697 * | 7/1997 | Le | 361/788 |
| 5,682,277 | 10/1997 | Hanson | 360/97.01 |
| 5,717,570 * | 2/1998 | Kikinis | 361/785 |
| 5,764,434 | 6/1998 | Hanson | 360/97.01 |
| 5,883,757 | 3/1999 | Hanson | 360/97.01 |
| 5,892,662 * | 4/1999 | Verma | 361/796 |
| 6,091,571 | 7/2000 | Hanson | 360/98.04 |
| 6,097,567 | 8/2000 | Hanson | 360/97.01 |

OTHER PUBLICATIONS

HP Server 1998 (photos 1–6) Pictures were taken Oct. 30, 1998.
IBM Netfinity1 Server 1998.
IBM Netinity Server 1.6 1998.
HP Disk Array 1994.
Sun Ultra Enterprise 1997.
Trimm Technolgy 1997.
Xyratex Salient Drive Carrier 1997.
Symbios 1998.
HP Disk Array 1995.
DEC Storage Works 1994.
HP NetServer LX Pro 1998.

* cited by examiner

MODULAR DATA STORAGE SYSTEM FOR REDUCING MECHANICAL SHOCK AND VIBRATIONS

BACKGROUND OF THE INVENTION

1. Field of the Invention

This invention relates in general to a modular data storage system, and more particularly to a process and apparatus for securing a data storage module within an enclosure to reduce mechanical shock and vibrations associated therewith during operation, handling and transportation.

2. Description of the Related Art

In general, a common data storage system comprises multiple data storage modules that slidably dock within an enclosure. Normally, the data storage modules provide disk drives which each includes a plurality of internal disks or platters that spin at high speeds within the drive during operation. Although there are numerous data storage modules and enclosures used in the industry today, none satisfy all of the performance requirements that the industry demands.

As illustrated in FIG. 1, a conventional data storage system 8 includes an enclosure 10 having multiple bay slots 12 that extend linearly from the front of the structure to a backplane where a circuit board 14 is mounted. The circuit board provides various multiple pin connectors 16 and circuitry on a silicon composite sheet of about 1.5 mm thick. Each bay slot 12 provides a set of upper and lower guide tracks 18 to aid the user in aligning the data storage module 20 within the desired bay slot 12. Each guide track 18 provides a width Wt.

A typical data storage module 20 consists of a drive tray 32, a securing mechanism 34, guide rails 36, and a data storage device 22, e.g. a disc drive. The drive tray 32 provides a rigid rectangular structure for receiving, securing, and mounting the disc drive. The securing mechanism 34 attaches to the front end of the drive tray 32 so that the user can lock each data storage module 20 in the desired bay slot 12 of enclosure 10. As illustrated, guide rails 36 reside on either side of the drive tray 32 and provide the necessary structure to be received by the guide tracks 18 of the enclosure slot 12. Each guide rail 36 provides a constant width Wr and thickness between distal ends.

The above data storage system is very popular in the industry due to its simplicity in design, ease of operation, and relatively low cost to produce. However, the conventional design has problems inherent to its construction during operation. In particular, the system provides a certain amount of designed gap between the guide rails 36 and the supporting guide tracks 18, and between the locking mechanism 34 and the enclosure 10. Because these gaps ensure ease of insertion and removal of the modules and manufacturability of the parts, they can not be eliminated. Consequently, a conventional data storage module is essentially free to move across the gaps, even after the conventional latching mechanism is locked.

This free boundary condition existing along the gaps, together with the large mass of a typical data storage device, make the module easily excited by shock and vibration regardless of whether they are self-generated by the data storage device or externally imparted upon the system. Consequently, while the rear end of a module is constrained in all three translational axes by the circuit board connector, the front end of the module is not well constrained. Therefore, this arrangement inherently forces the module to rotate about its better constrained end, the connector, in response to vibration, shock excitation, and gyroscopic motion, even when the force is translational. In other words, disc drives in the conventional data storage system are prone to rotational vibrations regardless of whether the input is external to the drive or self-exited by the drive itself during operation, handling and transportation.

Rotational vibration is an increasing concern to a data storage systems designer since it can have a significant impact on the performance and data integrity of modern disc drives. In addition, considering that the rotational speed and data track density of the disc drive will continue to rapidly increase in the future and disc drive manufacturers have very limited options to reduce or suppress the rotational vibrations at the drive level, the current problems exhibited by rotational vibrations will only get worse over time if no viable solutions are developed.

In attempts to resolve the above problems, some conventional data storage systems utilize elastomeric shock mounts to isolate or attenuate the shock and vibrations externally imparted upon the system. However, for the shock mounts to work properly, they must be allowed to deflect freely and therefore require extra sway and component space within the system. Such a system fails to achieve the maximum data storage density for the given data storage device, and provides an additional cost and process assembly step. In addition, given that the rotational vibrations may be caused by the forces that the drive itself generates, such as disk stack imbalance and the reaction from the actuator seek, the shock mounts fail to isolate or attenuate the rotational vibrations.

Other conventional data storage systems attempt to provide data storage module constraints inside the enclosure. These constraints are designed to rely on contacts between rigid members and non-compliant parts of the enclosure, and therefore do not take-up, fill, or effectively remove the gaps between the mating parts that allow for the rotational vibrations. For example, compliant members near the rear end of the enclosure between the data storage module and the enclosure. Consequently, such designs fail to effectively constrain the movement of the data storage modules in more than one direction.

Due to the problems inherent to the conventional data storage system, data storage devices in such systems are susceptible to shock and vibrations imparted upon the system during the transportation, end-use handling, and operation, and often sustain permanent physical damages or loss of data. In addition, disc drives in the conventional data storage system are very sensitive to the effect of rotational vibration and may suffer significant degradation of performance during the normal operation of the system.

The present invention is directed to overcoming, or at least reducing the effects of, one or more of the problems set forth above.

SUMMARY OF THE INVENTION

In one aspect of the present invention, an apparatus is provided for loading and securing a data storage drive within an enclosure. The enclosure comprises a frontal opening having a top side, a bottom side and a compliant backplane. The compliant backplane includes a plurality of electrical connectors mounted thereto and laterally spaced from the frontal opening. A compliant pressure plate attaches on the top side of the enclosure above various lock vias within the enclosure and adjacent to the frontal opening. The enclosure also includes top and bottom guide tracks defining a plurality of bay slots for slidably aligning and coupling the data storage drive with at least one of the plurality of electrical connectors. A drive tray having a left, right, and front side define top and bottom planes for attaching a data storage drive therebetween. First and second guide rails attach to the exterior surfaces of the left and right drive tray sides and are shaped to slidably mount within at least one of the data storage drive bay slots and between the respective top and bottom guide tracks. A lever handle having a securing knob at one end pivotally mounts to a front side of the drive tray. A latch attaches to the other end of the lever handle so that it may move to lock the drive tray within the desired slot enclosure and establish a stabilizing pressure between the securing knob, enclosure, backplane, and pressure plate.

In another aspect of the instant invention, a process is provided for securing a data storage module within a reciprocating enclosure. In particular, process comprising: gripping a pivotal lever handle attached to a front end of the data storage module, said handle being positioned in an extended position such that the users fingers rest across and between the lever handle and the front end of the data storage module; aligning guide rails of the data storage module with a set of guide tracks within the enclosure; slidably inserting said guide rails between said set of guide tracks until a knob of the handle contacts a lock via of the enclosure; and rotating the handle until an inner surface of the handle contacts the adjacent front end of the data storage module.

BRIEF DESCRIPTION OF THE DRAWINGS

Other aspects and advantages of the invention will become apparent upon reading the following detailed description and upon reference to the drawings, in which.

Figure 1:
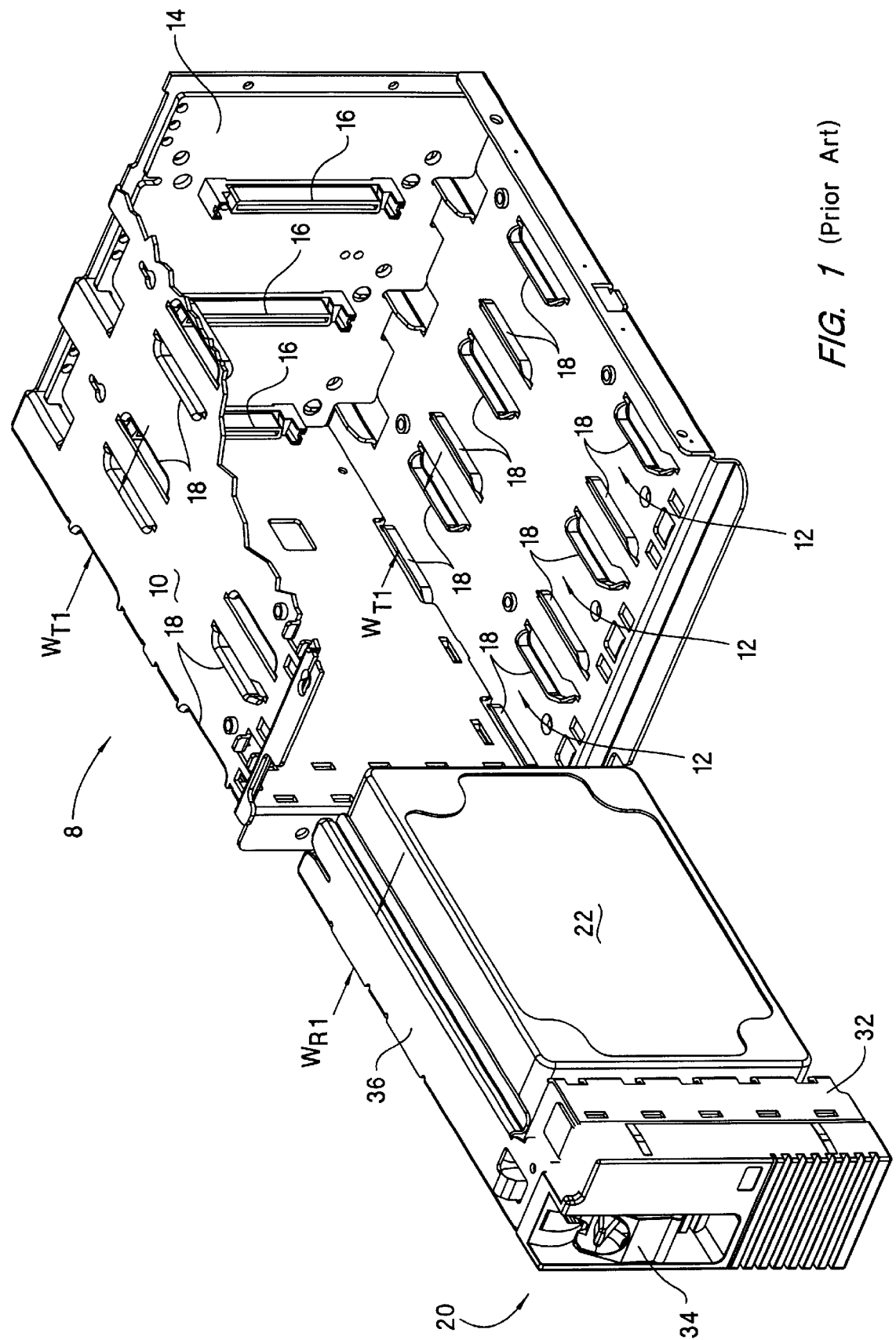
FIG. 1 illustrates a conventional data storage system.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In general, the present invention provides a compact, efficient, and effective means of constraining the movement of a data storage module, relative to an its enclosure, in all the translational and rotational degrees of freedom. More specifically, the present invention provides an apparatus and process for reducing any undesirable movement associated to an inherent gap created during conventional manufacturing processes. Consequently, the present invention can substantially reduce the risk of sustaining damages or degradation of the data storage performance due to any shock, vibration, and rotational movements without compromising the ease of operation, data storage density, manufacturing cost, and manufacturability of its parts.

Figure 2:
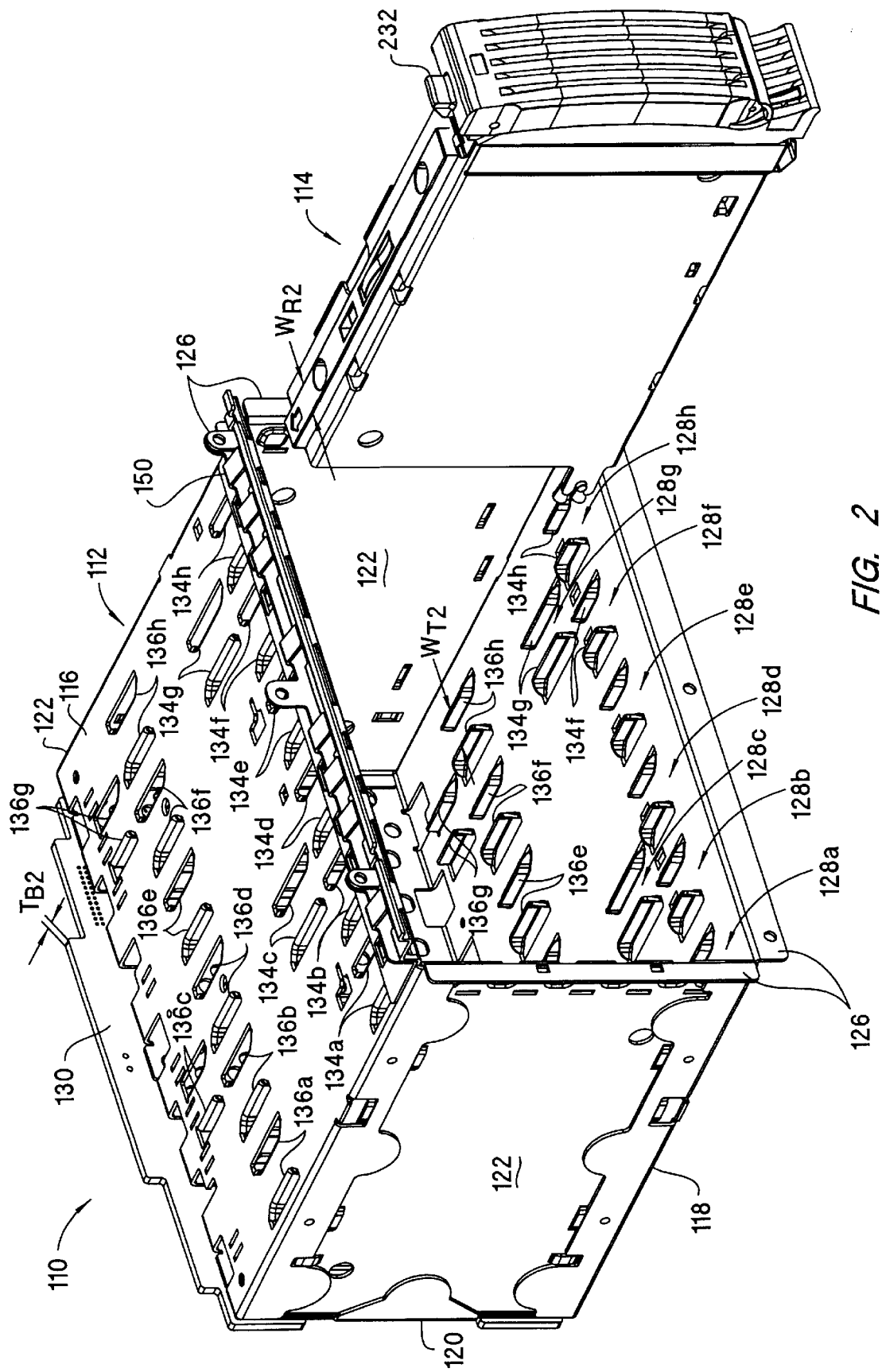
FIG. 2 illustrates a data storage system in accordance with the present invention.
Figure 3:
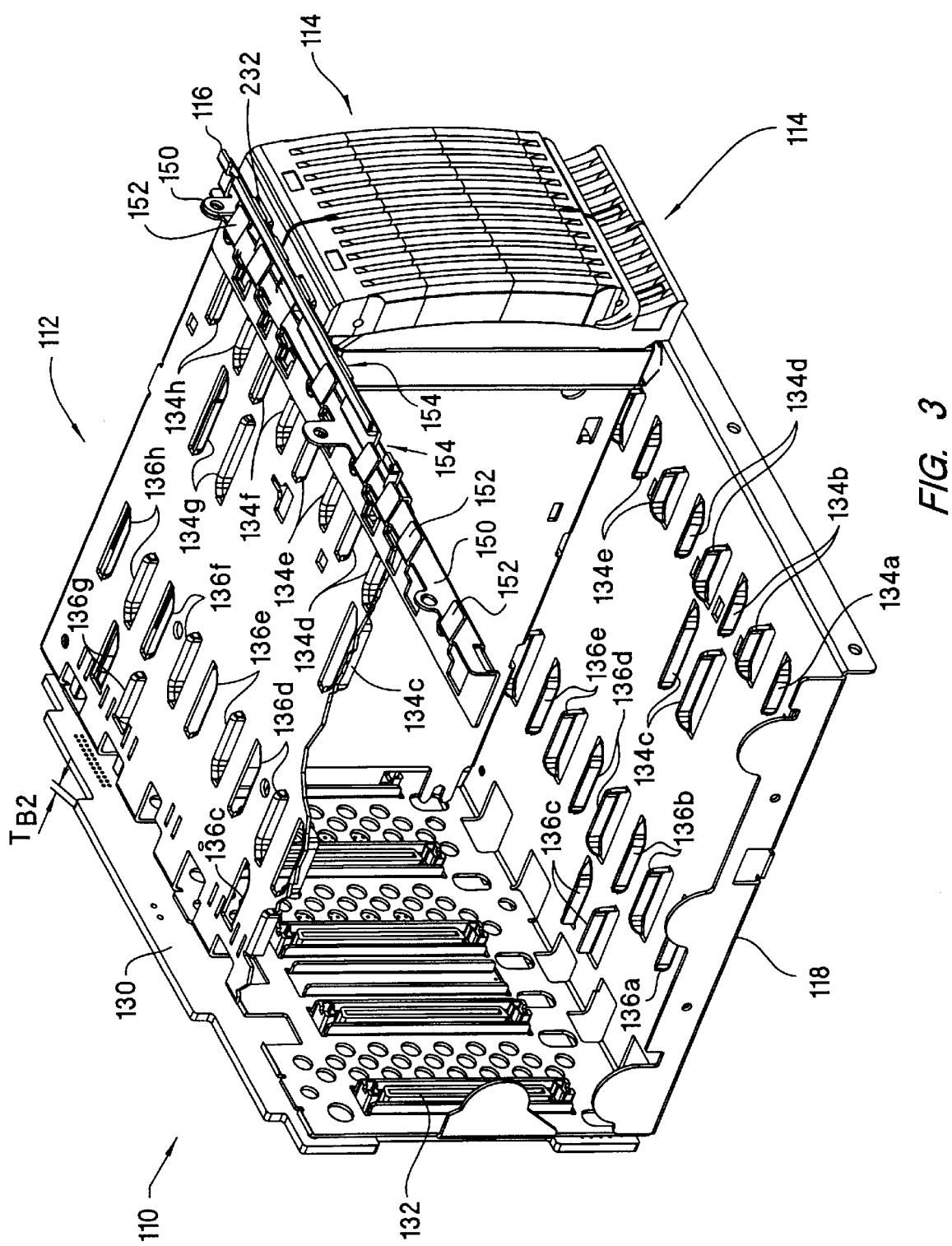
FIG. 3 illustrates a cut-away view of the data storage system of FIG. 2.

Referring now to the drawings, FIGS. 2 and 3 illustrate a data storage system 110 constructed in accordance with one embodiment of the present invention. Generally, system 110 comprises a enclosure 112 that forms part of an equipment component (not shown), and a plurality of data storage modules 114 that can be slidably inserted within enclosure 112. An equipment component could include a personal computer, a network server, or simply a system comprising a redundant array of inexpensive drives ("RAID"). A portion of the top and one side surface of enclosure 112 has been cut-away in FIG. 3 to better illustrate its interior structure and components.

As indicated in FIG. 2, enclosure 112 comprises a substantially rectilinear housing which includes a top side 116, a bottom side 118, a back side 120 and a pair of oppositely opposed lateral walls 122 to form an open-faced configuration. In this embodiment, a single piece of cold rolled steel is formed to form top, bottom, and back sides 116, 118 and 120, and two separate pieces of the same material are used to form walls 122. Using conventional methods, such as welding, rivets, adhesives and/or a complimentary slot and tab fitting, a rigid structure can be constructed as illustrated. To assist with the process of securing enclosure 112 within a desired equipment component, mounting flanges 126 are formed on the front edge of the top side 116, bottom side 118 and lateral walls 122.

Inside enclosure 112 is a plurality of bay slots 128a–128h. Each bay slot extends from the front of enclosure 112 to a main circuit board 130. Circuit board 130 provides a plurality of multi-pin connectors 132 for electrically connecting the respective data storage module of any given bay slot to circuit board 130. Each bay slot 128a–128h can be defined by two sets of guide tracks 134a–h and 136a–h. Guide tracks 134a–h and 136a–h are integrally formed on the top and bottom sides 116 and 118 and aid the user in aligning and securing the data storage modules 114 in their respective bay slots 128a–h.

Circuit board 130 may be positioned on either surface of back side 120 and attached by conventional means such as fasteners, adhesive and clamps. In a preferable embodiment, circuit board 130 will have a thickness $T_B$ of between about 2–3 mm, and provide a plurality of multi-pin connectors 132 and their associated circuitry. As will be described in more detail below, thickness $T_B$ of circuit board 130 will allow the necessary compliance or pressure to help firmly secure any data storage modules 114 that may be locked into enclosure 112.

As is apparent from FIG. 3, when data storage modules 114 are inserted within the enclosure 112, data storage modules 114 are tightly packed with respect to each other such that the system provides for a very high mass storage density. However, as discussed with regard to the prior art, this tightly packed configuration alone will not prevent the free motion that is allotted by the inherent manufacturing gaps. Consequently, the present invention has attached a stabilizing key 150 on the surface of enclosure top side 116. Stabilizing key 150 provides tabs 152 that reside above lock vias 154 and compliment each bay slot 128a–h. Tabs 152 are used to create a force on data storage module 114 when locked into a desired bay slot. This force, together with the resistive force provided by circuit board 130, helps to allow the data storage module 114 of the present invention to reduce any translational motion that may be created internal or external to the data storage module 114 due to the manufacturing gap as described in the background of the invention. In a preferred embodiment, stabilizing key 150 is made from a spring material such as stainless steel, however, other spring materials may be used, such as a carbon steel. The particulars of how stabilizing key 150 interacts with lock vias 154 and data storage module 114 will be described in detail below.

Figure 4:
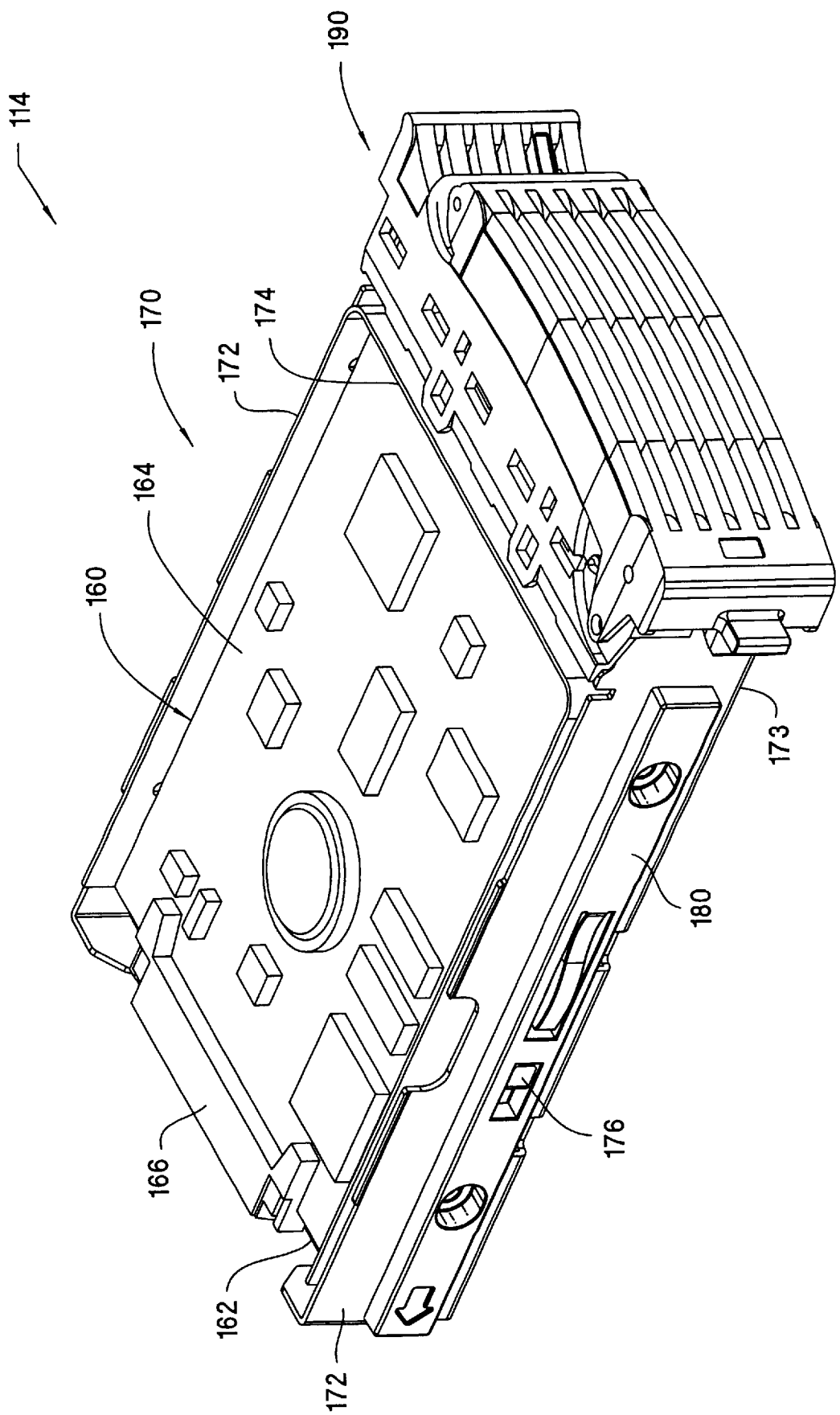
FIG. 4 illustrates an isometric view of the data storage module of FIG. 2.
Figure 5:
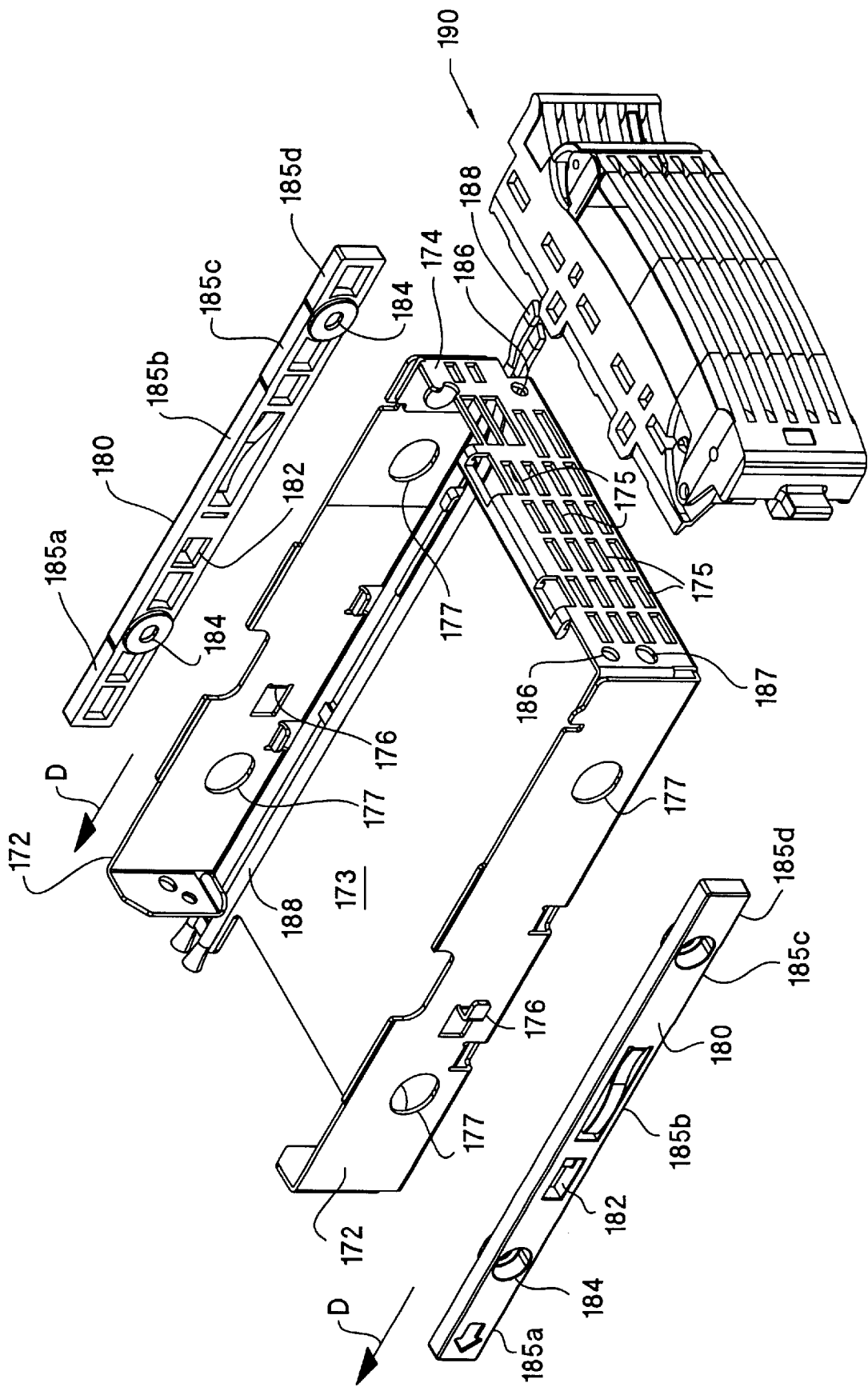
FIG. 5 illustrates an exploded view of the data storage module of FIGS. 4.

Turning now to FIGS. 4–5, data storage module 114 of FIGS. 2–3 has been removed from module enclosure 112 to illustrate its structure features. In general, data storage module 114 comprises a data storage device 160, a device tray 170, and a locking mechanism 190. Typically, data storage device 160 comprises a conventional disk drive that generally includes a sealed housing 162 containing a head/disk assembly comprising one or more disks or platters, which rotate at constant speeds during operation (not shown). Integrated with the sealed housing 162 is a circuit board 164 that includes a multiple pin connector 166. As is known in the art, disk drives are high precision instruments that are designed to provide trouble free operation in a mechanically stable environment. However, as discussed above, the high rotational speeds of the platters create gyroscopic forces that can cause excessive rotational vibrations that, if not properly attenuated, can interfere with proper drive operation and can even permanently damage the platters.

Drive tray 170 includes two containing walls 172, a floor 173, and a front plate 174. In a preferred embodiment, walls and floor 172, 173 are formed by a conventional unitary construction technique. In particular, a technique wherein a single piece of cold rolled steel is folded to form the aforementioned walls and floor before front plate 174 is attached using a conventional method such as screws, rivets, adhesive or solder. As illustrated in FIG. 5, front plate 174 provides multiple cut-outs to expose data storage device 160 to the ambient air outside of the module enclosure.

Persons of ordinary skill in the relevant arts will appreciate that although a unitary construction is preferred to form drive tray 170 and enclosure 112, alternative construction techniques are possible. For example, drive tray 170 and enclosure 114 could be made from a rigid polymeric resin mold. In turn, other drive tray and enclosure structures may be formed. For example, a drive tray that eliminates floor 173 and uses a unitary construction to form vertical walls 172 and front plate 174 from a single piece of material, or an enclosure that is formed as an integrated feature of the equipment component.

With the configuration of drive tray 170, walls 172 are substantially planar and rectilinear in shape and the outer surface of each wall 172 provides an integrated hook 176 and alignment holes 177 for receiving guide rails 180. Guide rails 180 provide recessed cut-outs 182 to receive hook 176, and plateaus 184 to fill alignment holes 177. More specifically, once hook 176 is positioned within recessed cut-out 182, guide rail 180 is moved in a direction D to lock hook 176 into the recessed portion of cut-out 182. This movement will also position plateaus 184 within alignment holes 177 and securely attach guide rail 180 to drive tray 170. Consequently, guide rails 180 can be securely coupled to drive tray 170 without any fastener means, like a screw, rivet, or adhesive. This feature is very effective and useful when the inventive structure must be shipped to a user or from a manufacturer.

Guide rails 180 are adapted to be received by bay slots 128a–h between respective guide tracks 134a–h and 136a–h of module enclosure 12 (see FIGS. 2–3). In particular, once aligned with the desired set of guide tracks, guide rails 180 facilitate insertion of the data storage modules 114 into enclosure 112. To assist with a smooth, yet securing insertion process, each guide rail 180 provides a stepped upper or lower surface 185a–d. This type of surface structure allows each guide rail 180 to provide a thinner front portion 185a to be received by guide tracks 134a–h, and yet a thicker back portion 185d to secure the guide rail between guide tracks 134a–h when the data storage module 114 is locked into position. Typically, guide rails 180 are constructed of a relatively soft material such as a polymeric resin. Such a material will dampen shocks and slide smoothly along the guide tracks 134a–134h during module insertion.

Before or after guide rails 180 are attached, locking mechanism 190 is secured to front plate 174. In particular, fasteners (not shown), such as screws, are passed through an inner side of front plate 174 at holes 186 and threaded into attachment holes 210 (see FIG. 6B) of locking mechanism 190. In addition, a data transfer element 188, to indicate when data is being transferred between the data storage drive 160 and circuit board 130 (see FIG. 1) is attached to floor 173 of drive tray 170, as illustrated in FIG. 5.

Figure 6A:
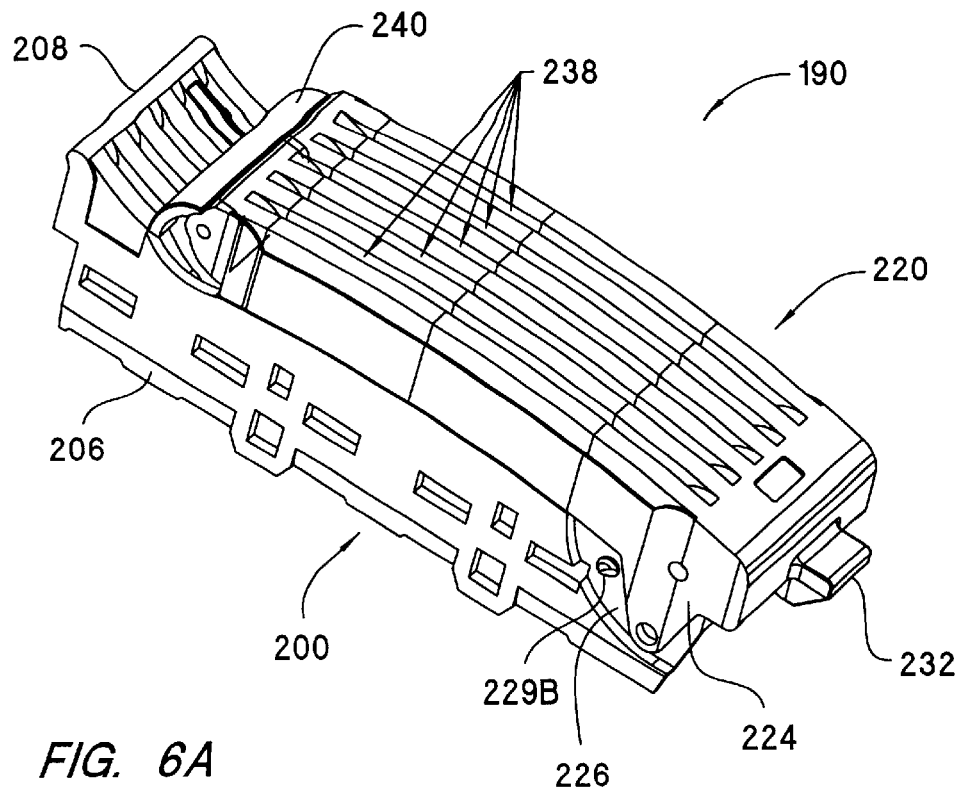
FIGS. 6A and 6B illustrate a top and bottom isometric view of the locking mechanism as shown in FIGS. 2–5.
Figure 6B:
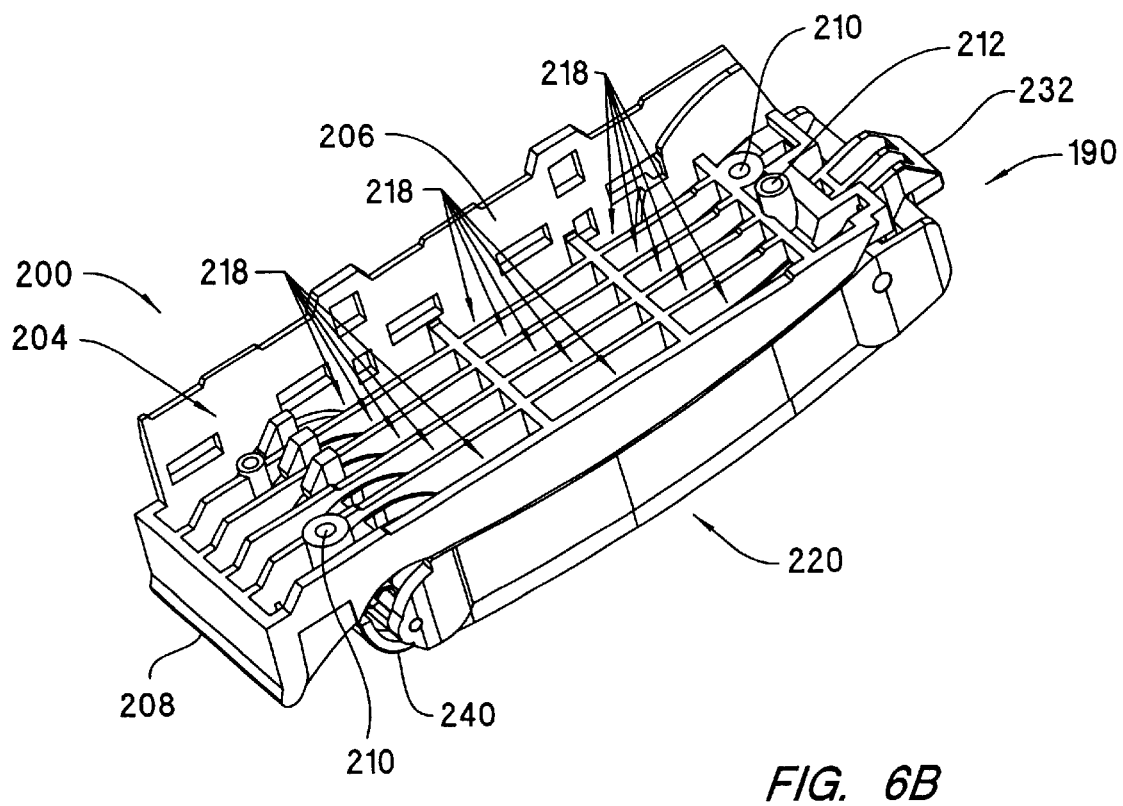
Figure 7:
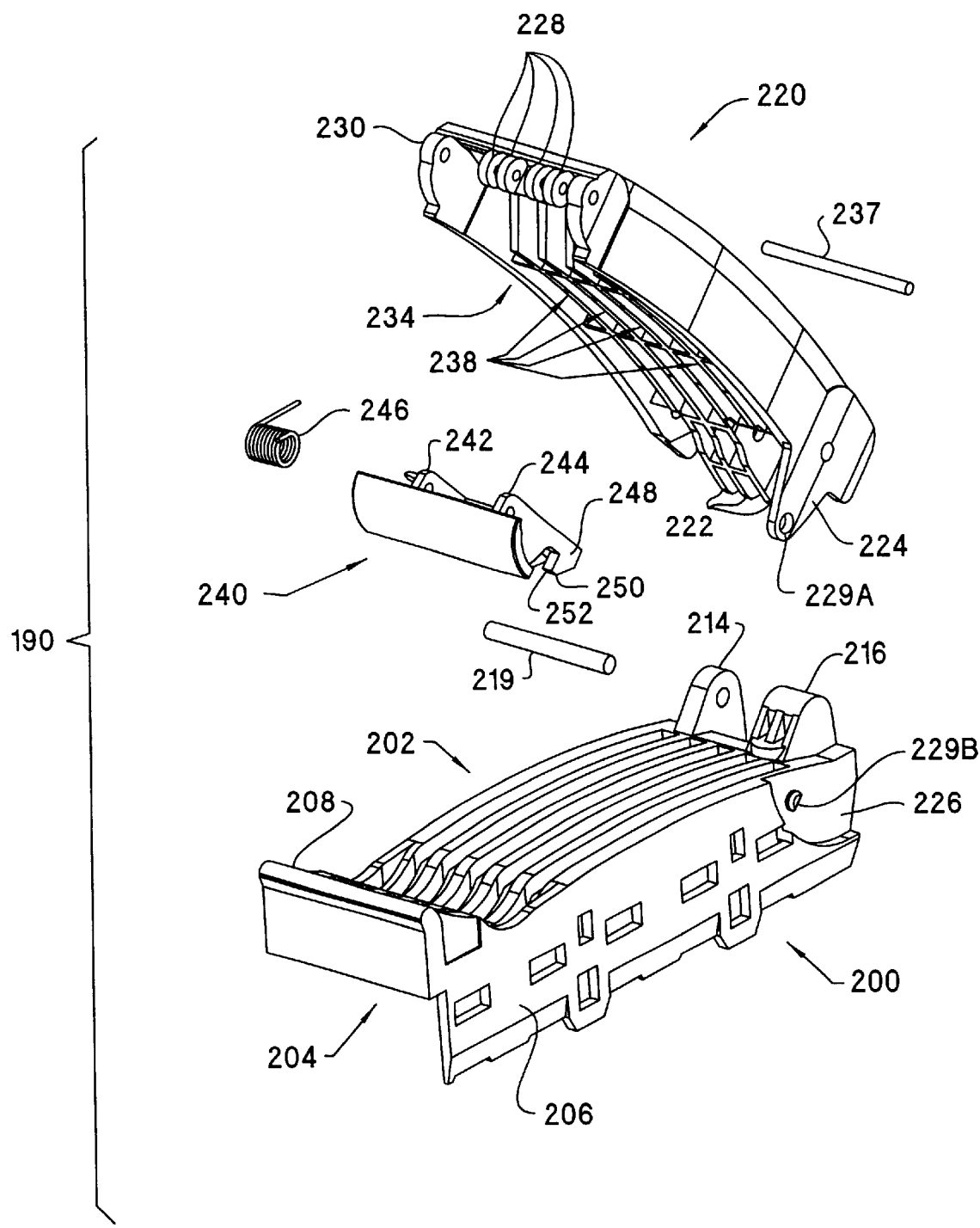
FIG. 7 illustrates an exploded view of the locking mechanism of FIGS. 6.

Referring now to FIGS. 6A, 6B and 7, a detailed description of locking mechanism 190 will follow. As illustrated in the FIGS., locking mechanism 190 comprises three main components: bezel 200, lever handle 220, and latch 240. Each component is constructed out of a durable polymeric material.

Bezel 200 has a substantially convex outer surface 202 and a substantially planar inner surface 204. The inner surface 204 is adapted to engage the surface of front plate 174 of drive tray 170 (see FIG. 5), and the convex outer surface 202 is adapted to complement the inner surface 234 of lever handle 220 and latch 240. More specifically, as illustrated in FIG. 6B, bezel 200 includes a flange 206, a lip 208, attachment holes 210, an alignment cylinder 212, lever hinges 214 and 216, and multiple cooling vents 218.

Flange 206 extends from a top side of bezel 200 to cover a portion of data storage drive 160 (see FIG. 4) and to provide a surface for an electromagnetic shield (not shown) to be attached between front plate 174 and bezel 200, if desired. Lip 208, as will be discussed in more detail below, enables the user to guide their fingers along bezel 200 so that latch 240 can be easily moved to unlock data storage module 114 from enclosure 112. Attachment holes 210 align with holes 186 on front plate 174 (see FIG. 5) to receive the necessary screws, and alignment cylinder 212 compliments hole 187 on front plate 174 to help align bezel 200 onto front plate 174. Lever hinges 214 and 216 are positioned at a pivotal end of outer bezel surface 202, laterally spaced from lip 208. Lastly, multiple cooling vents 218 allow air to pass to/from data storage drive 160 and enclosure 112 through front drive tray plate 174, bezel 200 and lever handle 220 from/to an area outside of the data storage system. In addition, as will be described in more detail below, multiple cooling vents 218 allow for latch 240 to pivot and lock onto a portion of bezel 200 when data storage module 114 is firmly positioned within enclosure 112 (see FIG. 2).

Lever handle 220 connects to bezel 200 by positioning lever hinges 222 between complementary bezel hinges 214 and 216. Likewise, latch 240 connects to lever 220 by positioning latch hinges 242 and 244 between complementary lever handle hinges 228 and 230. Next pin 237 is positioned through the receiving holes of hinges 222, 214, 216 to create a pivot point about which lever handle 220 can angularly pivot, and pin 219 is positioned through the receiving holes of hinges 228, 230, 242, 244 to create a pivot point about which latch 240 can angularly pivot.

The pivotal limits of lever handle 220 can be generally defined by the travel of arm 224 along an arcuate groove 226, whereas the pivotal limits of latch 240 can be generally defined by a tension spring 246 positioned between hinges 230 and 242. In particular, lever 220 reaches a fully extended position (see FIGS. 2 or 8A) when a hole 228 of arm 224 is filled by a cylinder 229 of bezel 200 and the pivotal end of lever handle 220 contacts bezel 200. In contrast, lever handle 220 is in a locked or compressed position (see FIGS. 3–6B and 8C) when the inner contour 234 of lever 220 contacts the complimentary outer contour 202 of bezel 200. Latch 240 is in an extended position when spring 246 is fully extended and latch hook 248 is position perpendicular to lever handle 220 (see FIGS. 2 and 8A). In contrast, latch 240 is in a fully compressed position when spring 246 compresses to such that a portion of latch 240 retracts within an air inlet 238 of lever handle 220.

The skilled artisan should appreciate that lever handle of the present invention presents advantages not realized in conventional systems. First, the lever handle permits the user to obtain a firm control over data storage module 114. This is particularly important when the data storage module contains a latest generation disk drive, wherein the platters within the drive may still spin for 20 to 40 seconds after its removal from a bay slot (e.g., hot swap) and therefore is creating gyroscopic forces which could cause the user to lose their grip of the module. Second, the lever handle provides the user with a way to carry data storage module 114 without having to touch disk drive 160 or drive tray 170. This feature is important since disk device 160 may be hot when first removed from enclosure 112 or may have stored electrostatic charges, either of which could cause the user to drop the data storage module.

As suggested earlier, lever handle 220 includes a plurality of air inlets 238 that are used to draw air from the atmosphere for cooling of the data storage devices 160 and enclosure 112. This is possible since air inlets 238 of lever 220 compliment air inlets 218 of bezel 200 and air inlets 175 of drive tray 170. The above structure provides the most effective means to allow air to transfer from the atmosphere outside of the module enclosure since all inlets extend across the entire surface of locking mechanism 190.

Persons of ordinary skill in the relevant arts should appreciate that bezel 200 could be eliminated from the data storage module if the features associated therewith where incorporated with front plate 174 of drive tray 170. In turn, front plate 174 could be removed and bezel 200 connected directly to drive tray 170 to provide the structural features otherwise provided by front plate 174 of drive tray 170.

Now that the primary structural features of the invention have been described, the insertion, locking and removal of the inventive data storage module 114 with the module enclosure 112 will follow. For this example, reference will be made to FIGS. 8A–8D. These FIGS. illustrate a side view of FIGS. 2 and 3 having the side wall 122 adjacent bay slot 128h removed. Consequently, the following example will be described for only bay slot 128h. A skilled artisan should appreciated that the same method used to insert, lock and remove a data storage module 114 in bay slot 128h can also be used for bay slots 128a–128g (see FIGS. 2 and 3).

Figure 8A:
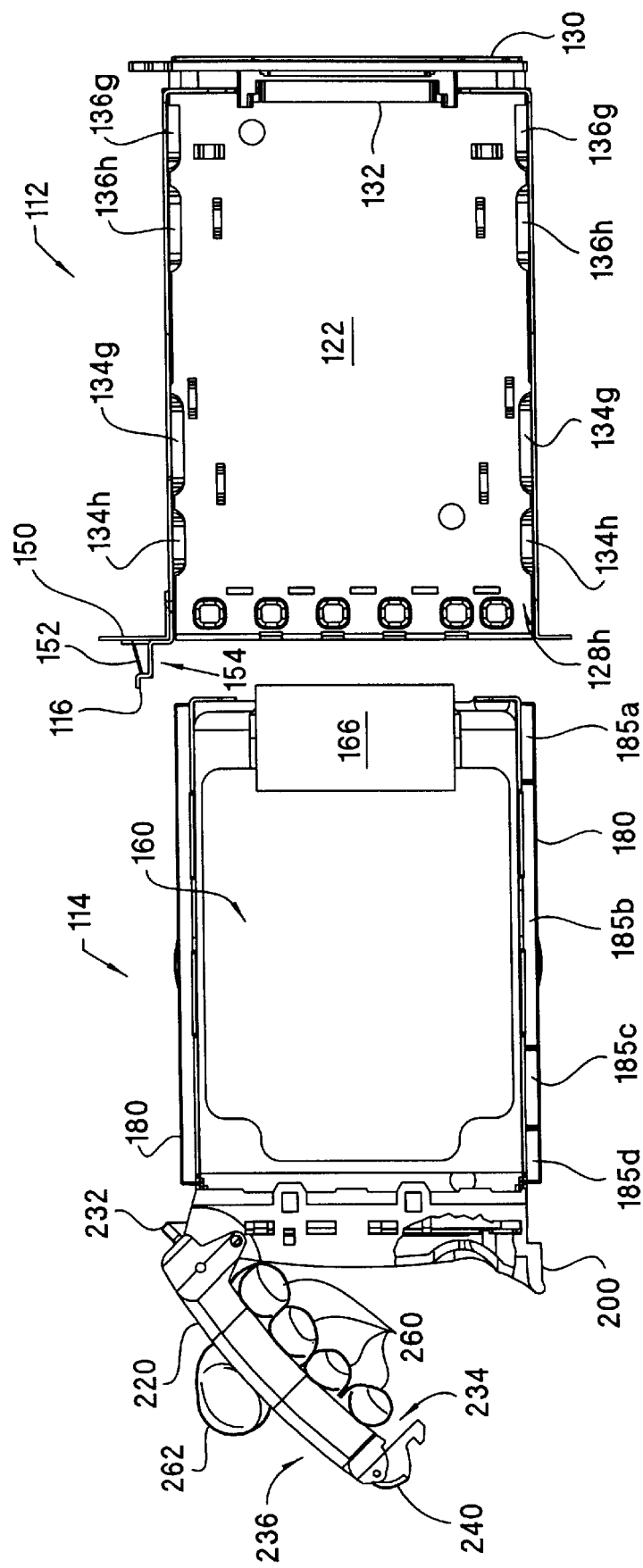
FIGS. 8A–8D illustrate a process for inserting, locking and removing the data storage module of FIGS. 2–5 within an enclosure using the locking mechanism of FIGS. 6A, 6B and 7.

When a data storage module 114 is ready for insertion into bay slot 128h of enclosure 112, lever handle 220 is fully extended as illustrated in FIG. 8A. In such a position, the user can firmly grasp data storage module 114 by allowing the inner surface 234 to rest across their fingers 260 and by wrapping their thumb 262 across the opposite outer surface 236 of lever handle 220. With the users hand in this position, the index finger will typically be slightly wedged between lever handle 220 and bezel 200, and the palm of the user's hand will contact the side of lever 220. In other words, because the lever covers nearly the entire surface of the locking mechanism, a user can firmly grip the data storage module in the palm of their hand to prevent any transitional motion during a hot swap operation.

Figure 8B:
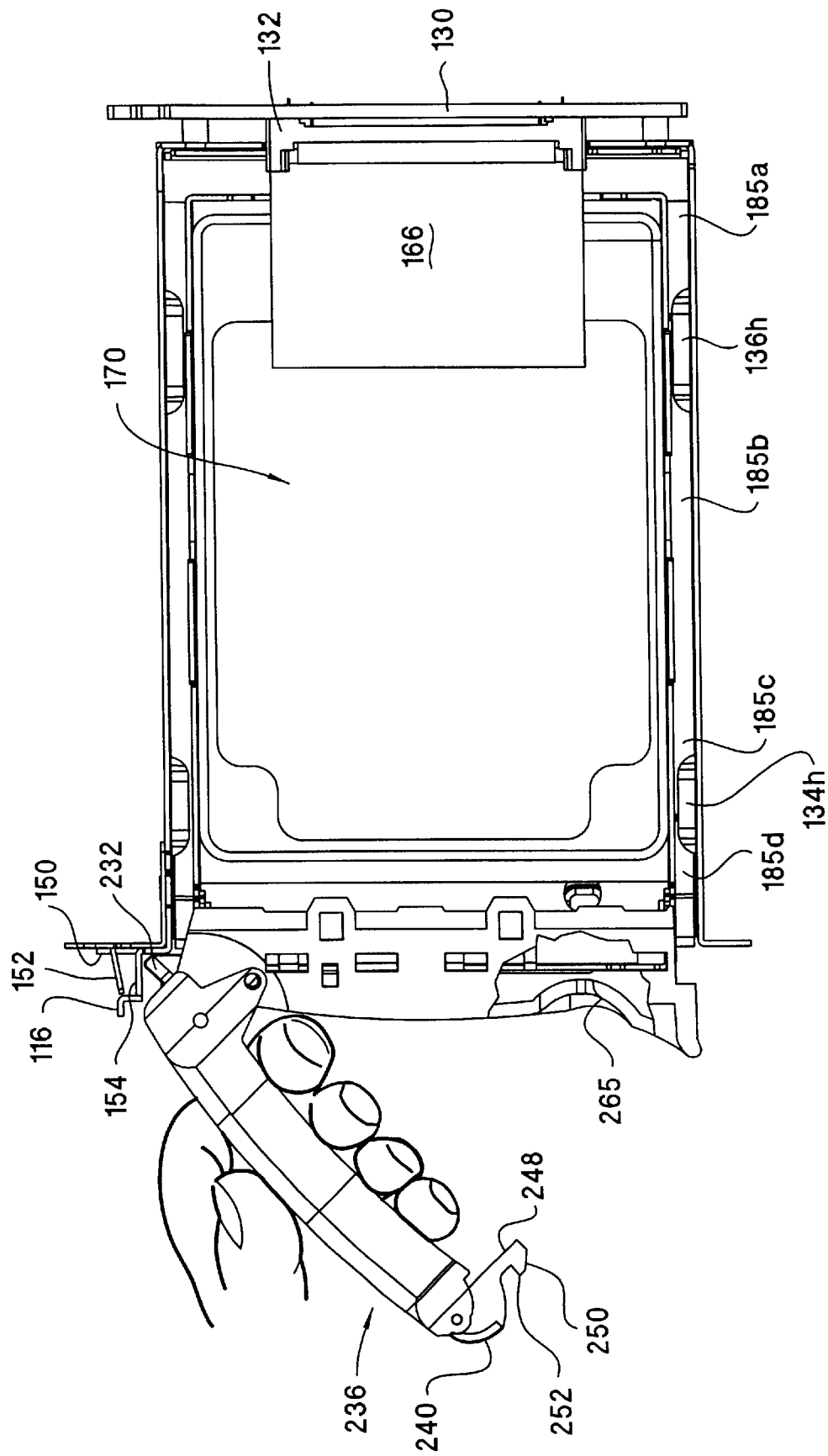

To insert data storage module 114 within enclosure 114, the user first aligns front portion 185a of guide rails 180 between the top and bottom front guide tracks 134h. Next, the thinnest portion 185a of guide rails 180 is inserted between guide tracks 134h and slid forwardly into enclosure 112. With continued pressure, central portions 185b and 185c of guide rails 180 pass smoothly along top and bottom front guide tracks 134h and eventually engage the top and bottom back guide tracks 136h. When data storage module 114 is nearly fully inserted into bay slot 128h as illustrated in FIG. 8B, contact is made between the leading edge of lock knob 232 and trailing edge of lock via 154, the thickest portion 185d of guide rails 180 is positioned between top and bottom front guide tracks 134h to provide a snug fit between guide tracks 134h, and connector 166 of disk drive 170 is aligned with reciprocating multi-pin connector 132 of circuit board 130.

At a final stage of the insertion process, the user will first remove their fingers 260 from the inner surface 234 of lever 220 and position them on the outer surface 236 of lever handle 220. Next, the user will apply a forward pressure from their fingers 260 to rotate lever 220 in a downward or compressing direction such that the trailing edge of lock knob 232 contacts the leading edge of lock via 154. This motion continues until hook 248 of latch 240 contacts an inner portion 265 of bezel 200. As hook 248 contacts inner portion 265, latch 240 rotates counter-clockwise to retract within the inner surface of lever handle 220. At the same time, the forces exerted between lock knob 232 and the leading edge of lock via 154 moves data storage module 114 forward of the distance needed to attain initial engagement of connectors 132, 166.

Figure 8C:
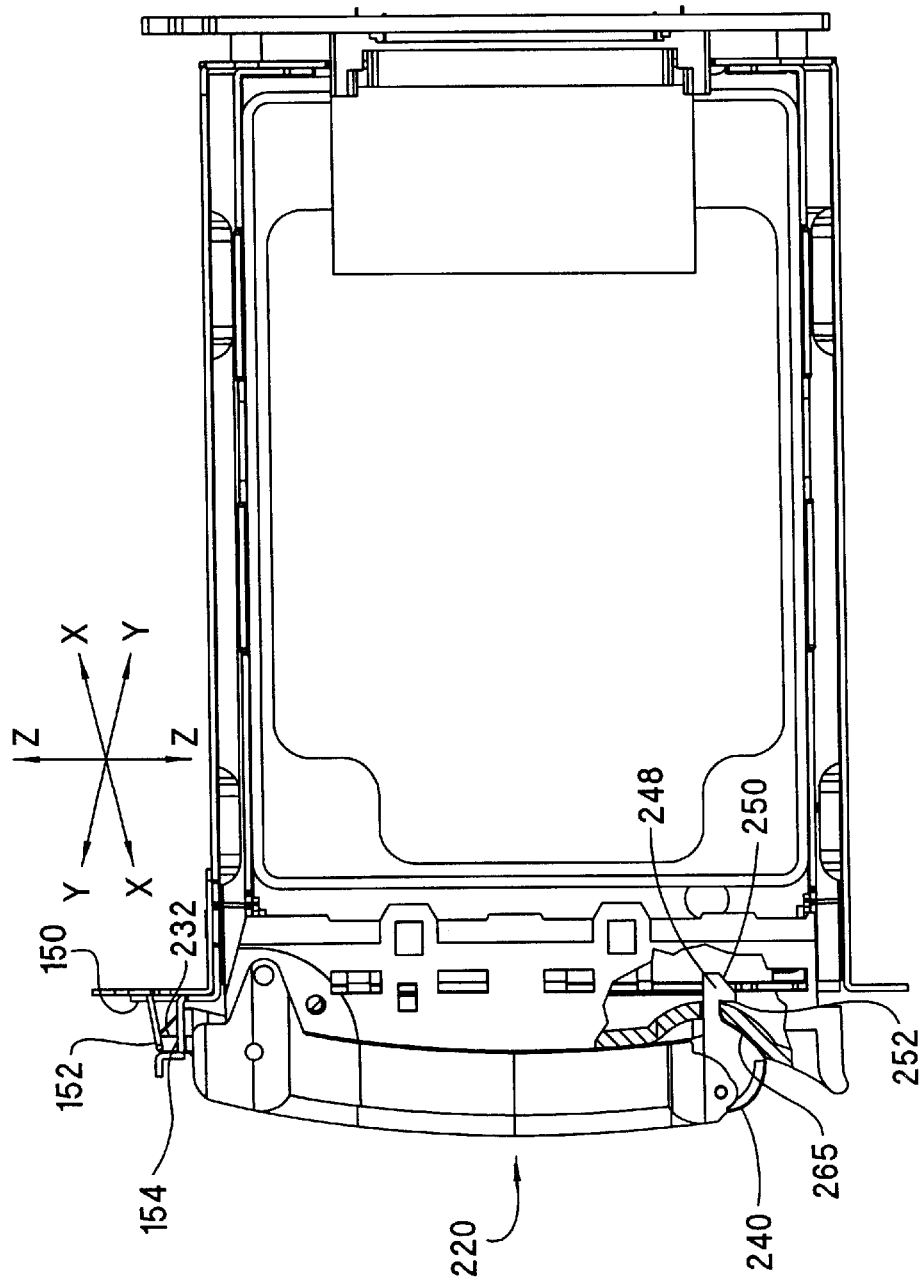

This motion continues until a portion 250 of hook 248 clears bezel portion 265 and thereby allows spring 246 of lever and latch 220, 240 to rotate hook 248 clockwise such that hook platform 252 wraps around bezel portion 265 as illustrated in FIG. 8C. With hook 248 in this locked position, data storage module 114 can be contained within module enclosure 112 to reduce any shock or vibration therein. More specifically, when hook 248 is positioned to lock lever handle 220 against bezel 200, lever knob 232 is firmly wedged against pressure plate tab 152 and against the leading edge of lock via 154 to create a vertical and horizontal pressure, respectively, between data storage module 114, and circuit board 130.

This pressure created between data storage module 190, enclosure tabs 152, and circuit board 130 is directly related to the pliability or thickness of circuit board 130 and pressure plate tab 152. Consequently, with the help of the mated connectors 166 and 132 and the pressure applied to the stepped guide rail portions 185d by guide tracks 134h, the inventive system reduces, if not prevents, any motion of data storage module 114 in all directions. In particular, a) Vertical and longitudinal movements of data storage module 114 relative to enclosure 112 are constrained, even with the manufacturing gap as described in the background of the invention. The circuit board or backplane 130 in the longitudinal direction and the pressure plate tabs 152 on enclosure 112 in the vertical direction provide the compliance to the mass of the data storage module 114. The resulting system 110 works as a vibration/shock isolator. This is possible because the geometry, material, and the location of attachment of pressure plate tabs 152 are designed so that the combined system behaves like a mass-spring system with a hardening spring. A spring is called "hardening" if the incremental force required to produce a given displacement becomes increasingly greater as the spring is deformed. The advantage of using the hardening spring is that it can effectively control the large movement of the module in response to the shock and vibration imparted upon the system.

b) The movement of the module in the horizontal direction is damped by the Coulomb friction damping. When the module is fully inserted in enclosure 112 and lever handle 220 is closed, pressure plate tabs 152 on enclosure 112 develops compressive forces against the lock knob 232 of the lever handle 220. A force, known as Coulomb friction, is generated in opposing directions of the movement of the module and attenuates the vibrations that were resulted from shock and movement imparted upon the system.

c) Since the horizontal axis of the module is parallel with those of the disk stack spindle and the rotary actuator of a typical modem disk drive, the rotational constraint of the module about this axis is critical for prevention of rotational vibration of the disk drives in a data storage system. When the module is in the fully inserted position, the strategically located pivotal end of the lever is subjected to the compressive forces generated by pressure plate tabs 152 of enclosure 112 and the movement of data storage module 114 in the vertical direction is compliantly constrained without a gap. This compliance makes the boundary condition of the front end of the module similar to that of the rear end, therefore making the module less responsive to either self-generated or externally applied rotational vibration excitations.

d) Rotational movements of data storage module 114 relative to enclosure 112 about its vertical and longitudinal axes are damped through the friction developed between pressure plate tabs 152 on enclosure 112, lock knob 232 of lever handle 220, leading edge of lock via 154 and bay slot. Damping rotational vibrations about these axes will reduce the risk of performance degradation due to the gyroscopic effect of the rotational vibrations imparted upon the high rotational speed disk drives.

Consequently, these points of pressure allow the data storage module of the present invention to reduce any vibration or motion within the manufacturing gap created by an internal or external force associate to the system in all translational directions.

Figure 8D:
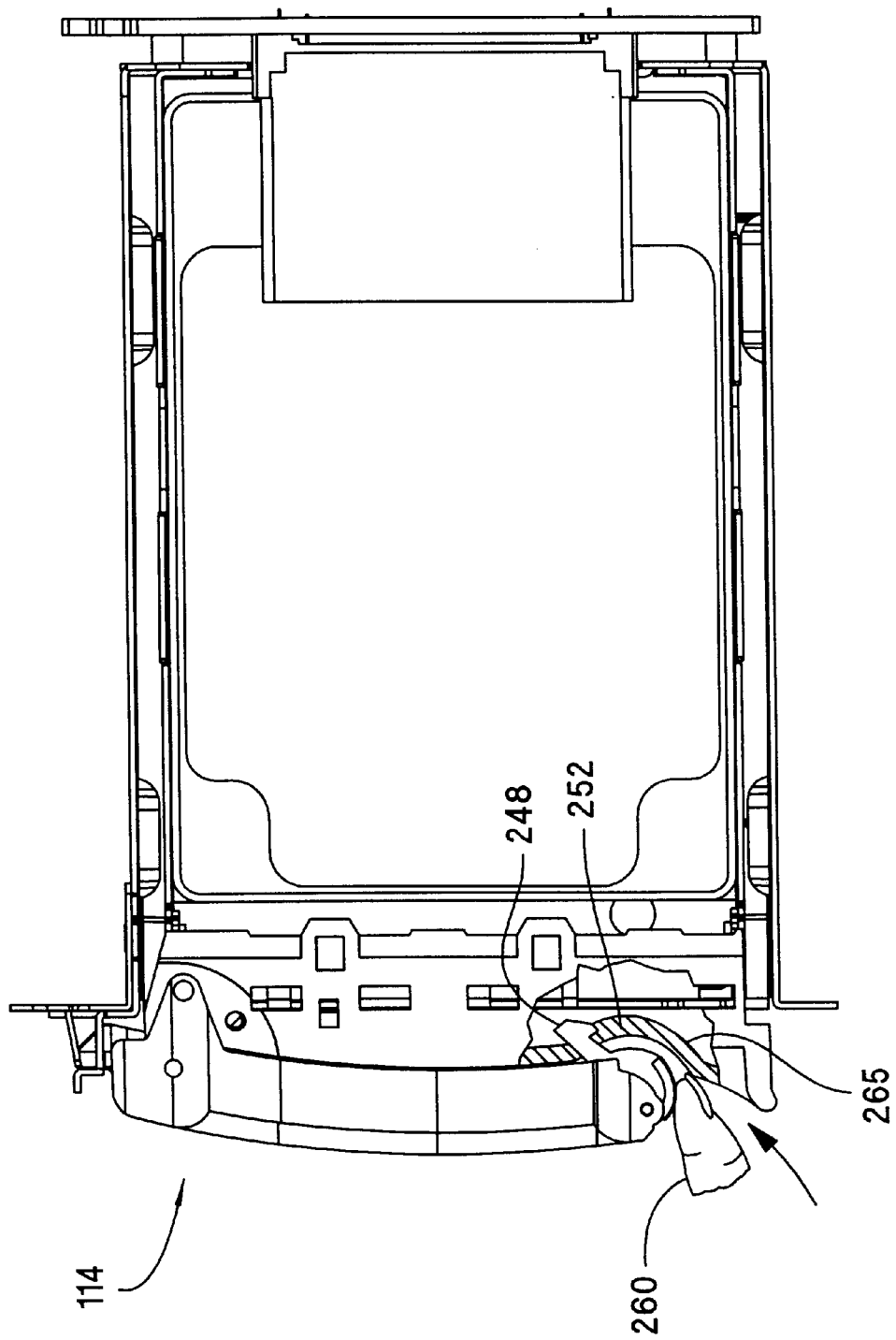

The smooth motion used to insert data storage module 114 is transparent with the process for removing the same. In particular, FIG. 8D illustrates how the user can remove data storage module 114 by first positioning their fingers 160 between bezel lip 208 and lever latch 240. With a small smooth pressure against latch 240, spring 246 (see FIG. 7) will compress to allow latch 240 to rotate counter-clockwise and thereby release hook 248 from bezel portion 265. At this stage of the process, the user will allow the pressure created by circuit board 130 to push data storage module slightly out of module enclosure 114 while they begin to lift lever 220 in an upward or extended rotation.

The rotation of lever handle 220 forces the leading edge of lock knob 232 against the leading edge of lock via 154 of enclosure 112 to slide data storage module 114 outwardly from its bay slot 128h and disengage connectors 132, 166 within enclosure 112. Once lever 220 has reached an extended position as illustrated in FIG. 8B, the user will position their hand around lever 220 to obtain a firm grip for removal as used for insertion. As described earlier, this firm grip will allow the leverage the user will need to prevent any gyroscopic motion that may occur during a hot swap and/or any translational motion created by the weight of the data storage module 114 once it is removed from module enclosure 112 as illustrated in FIG. 8A.

The above process allows a data storage module 114 to be quickly and easily electrically connected to circuit board 130 of the module enclosure 112. In turn, the process for doing the same requires a relatively small continuous force to provide a smooth locking and unlocking motion so that no jolting motions or excessive pressure has to be used that might otherwise destroy or damage the disk drive memory or circuit board. Once latched, data storage module 114 is held tightly in place to provide a hard mount within module enclosure 112. This hard mounting greatly attenuates the rotational vibrations created by the spinning platters and helps to prevent rotational vibration problems between the individual platters.

In summary, the present inventive modular data storage system provides a data storage module that can interact with an enclosure to create multiple pressure points within the system such that the negative effects of manufacturing gaps for a conventional system can be reduced, if not eliminated. In addition, the present invention provides a reliable, cost efficient and effective way to reduce translational motion within a conventional data storage system.

What is claimed is:

1. A data storage system, comprising:

an enclosure comprises a frontal opening, a compliant backplane, a plurality of bay slots and associated vias, and a pressure plate, said backplane including a plurality of first electrical connectors, said bay slots extend from said frontal opening to said first electrical connectors, said pressure plate attaches adjacent to said frontal opening and above said plurality of bay slots and vias;

at least one data storage module including a data storage drive, a locking mechanism, and a drive tray, said data storage drive having a second electrical connector sized and configured to mate with one of said plurality of first electrical connectors and a front plate laterally spaced from said second electrical connector; said drive tray containing said data storage device and including first and second guide rails being shaped to slidably mount within at least one of said plurality of bay slots; and said locking mechanism including a latch and a lever handle, said lever handle being coupled at one end to said front plate and the other end being couple to said latch; and wherein, said lever handle pivotally moves to lock said at least one data storage module within one of said plurality of bay slots by creating a stabilizing pressure between the data storage module and the enclosure.

2. The apparatus of claim 1, wherein said lever handle further including a spring mechanism coupled between said drive tray and lever handle to allow said lever handle to provide a resisting pressure when moving said lever handle.

3. The apparatus of claim 1, wherein said latch pivotally connects to said lever handle.

4. The apparatus of claim 1, wherein said latch further includes a spring mechanism mounted between said lever handle and said latch, said spring mechanism provides a pressure when moving said pivotal latch.

5. The apparatus of claim 1, wherein said latch further includes a pivotal hook for locking said data storage module within said bay slot against an adjacent portion of said drive tray.

6. The apparatus of claim 1, wherein said first and second guide rails further include a stepped surface that is thinner at an end adjacent said second electrical connector than the end adjacent said locking mechanism.

7. The apparatus of claim 6 wherein said stepped surface of said first and second guide rails resides on only one side of said first and second guide rails .

8. The apparatus of claim 1, wherein said lever handle further includes a lock knob attached to said pivotal end and capable of fitting through at least one of said vias to apply a pressure against a reciprocating portion of said pressure plate, enclosure and backplane.

9. The apparatus of claim 1, wherein the outer surface of said lever handle and drive tray further include a plurality of corresponding venting holes to assist with the flow of air between the drive tray, enclosure and area outside the system.

10. The apparatus of claim 1, wherein said locking mechanism further includes a bezel connected between said front plate and said lever handle.

11. The apparatus of claim 1, wherein said stabilizing pressure can be translated into a vertical, horizontal and lateral plane.

12. The apparatus of claim 1, wherein said pressure plate is made from a spring alloy selected from the group including stainless steel and carbon steel.

13. The apparatus of claim 1, wherein said guide rails and lever arm are made from a polymeric material.

14. A process for securing a data storage module within a reciprocating enclosure, comprising:

gripping a pivotal lever handle attached to a front end of the data storage module, said handle being positioned in an extended position such that the users fingers rest across and between the lever handle and the front end of the data storage module;

aligning guide rails of the data storage module with a set of guide tracks within the enclosure;

slidably inserting said guide rails between said set of guide tracks until a knob of the handle contacts a lock via of the enclosure; and rotating the pivotal lever handle until said locking knob fills said locking via to apply a stabilizing pressure between a pressure plate, said locking via, and the enclosure.

15. The assembly of claim 14, further including applying pressure to a pivotal latch of said pivotal lever handle to unlock said data storage module from said enclosure.

16. The apparatus of claim 14, wherein said stabilizing pressure can be translated into a vertical, horizontal and lateral plane.

* * * * *

UNITED STATES PATENT AND TRADEMARK OFFICE
CERTIFICATE OF CORRECTION

PATENT NO.      : 6,288,902 B1
DATED           : August 11, 2001
INVENTOR(S)     : Kwang Ho Kim et al.

It is certified that error appears in the above-identified patent and that said Letters Patent is hereby corrected as shown below:

<u>Column 12</u>,
Line 39, add claims 17-20 as follows:

-- 17. A data storage apparatus, comprising:
an enclosure including a frontal opening, a compliant backplane, and a pressure plate that attaches adjacent to the frontal opening of the enclosure; and at least one data storage module having a locking mechanism; wherein the locking mechanism pivots to lock the at least one data storage module within the enclosure to create a stabilizing pressure between the data storage module, the compliant backplane, the pressure plate, and the enclosure.

18. The apparatus of claim 17, wherein the locking mechanism further includes a latch and a lever handle, the lever handle being coupled at one end to a front surface of the data storage module and the other end being coupled to the latch.

19. The apparatus of claim 17, wherein the enclosure further includes a bay slot that extends from the frontal opening to the compliant backplane for receiving the at least one data storage module, and a vias adjacent to the pressure plate for receiving a portion of the locking mechanism.

20. The apparatus of claim 17, wherein the at least one data storage module further includes first and second guide rails having a stepped surface. --

Signed and Sealed this

Seventeenth Day of August, 2004

JON W. DUDAS
*Acting Director of the United States Patent and Trademark Office*